US009761787B2

(12) United States Patent
Omidi et al.

(10) Patent No.: US 9,761,787 B2
(45) Date of Patent: Sep. 12, 2017

(54) CONSENSUS-BASED MULTI-PIEZOELECTRIC MICROCANTILEVER SENSOR (71) Applicant: The Board of Trustees of The University of Alabama, Tuscaloosa, AL (US)

(72) Inventors: Ehsan Omidi, Tuscaloosa, AL (US); Seyed Nima Mahmoodi, Tuscaloosa, AL (US)

(73) Assignee: The Board of Trustees of The University of Alabama, Tuscaloosa, AL (US)

(*) Notice: Subject to any disclaimer, the term of this patent is extended or adjusted under 35 U.S.C. 154(b) by 0 days.

(21) Appl. No.: 15/171,378

(22) Filed: Jun. 2, 2016

(65) Prior Publication Data

US 2016/0356811 A1 Dec. 8, 2016

Related U.S. Application Data (60) Provisional application No. 62/169,872, filed on Jun. 2, 2015.

(51) Int. Cl.
*G01Q 10/04* (2010.01)
*G01Q 70/18* (2010.01)
(Continued)

(52) U.S. Cl.
CPC .......... *H01L 41/18* (2013.01); *G01Q 10/045* (2013.01); *G01Q 70/18* (2013.01); *H01L 41/1132* (2013.01); *H01L 41/1136* (2013.01)

(58) Field of Classification Search
CPC ..... H01L 41/297; G01Q 10/045; G01Q 70/18
See application file for complete search history.

(56) References Cited

U.S. PATENT DOCUMENTS 5,321,685 A * 6/1994 Nose .................. B82Y 35/00
250/310
5,334,835 A * 8/1994 Nakayama ........... G01Q 60/16
250/307
(Continued)

FOREIGN PATENT DOCUMENTS

EP 0472342 A2 2/1992
WO 2014168924 A1 10/2014

*Primary Examiner* — Jason McCormack
*Assistant Examiner* — Sean Luck
(74) *Attorney, Agent, or Firm* — Meunier Carlin & Curfman LLC (57) ABSTRACT Systems and methods are disclosed that describe a MEMS device and a method of sensing based on a consensus algorithm. The MEMS device is a sensor comprising multiple piezoelectric layers attached to a microcantilever. It can be used to sense deflections or variations in corresponding parameters of systems in micro- and nano-scales. Multiple piezoelectric elements on a microcantilever can provide a more accurate measurement of the microcantilever's deflection. The device can eliminate bulky laser sensors in SPMs and provide additional use as a biosensor, or chemical sensor at the micro- and nano-scale. The consensus sensing algorithm can provide added robustness into the system. If one of the sensing elements or electrodes fails during a sensing process, other elements can compensate and allow for near zero-error measurement.

23 Claims, 8 Drawing Sheets (51) Int. Cl.
  *H01L 41/297* (2013.01)
  *H01L 41/18* (2006.01)
  *H01L 41/113* (2006.01)

(56) References Cited

U.S. PATENT DOCUMENTS

| | | | | |
|---|---|---|---|---|
| 5,506,829 A * | 4/1996 | Yagi | ........................ | B82Y 35/00 |
| | | | | 369/126 |
| 5,656,769 A * | 8/1997 | Nakano | .................. | G01Q 10/04 |
| | | | | 310/328 |
| 5,966,787 A * | 10/1999 | Nakayama | ............. | B82Y 35/00 |
| | | | | 29/25.35 |
| 6,748,795 B1 * | 6/2004 | Jing | ........................ | B82Y 35/00 |
| | | | | 250/307 |
| 2006/0112760 A1 * | 6/2006 | Hansma | .................. | G01Q 10/04 |
| | | | | 73/105 |
| 2009/0007645 A1 * | 1/2009 | Shih | ........................ | B82Y 35/00 |
| | | | | 73/105 |
| 2010/0043107 A1 * | 2/2010 | Proksch | .................. | G01Q 60/24 |
| | | | | 850/40 |
| 2011/0080069 A1 * | 4/2011 | Cueff | .................... | H01L 41/094 |
| | | | | 310/328 |
| 2012/0070039 A1 * | 3/2012 | Morimoto | .............. | G01Q 30/04 |
| | | | | 382/108 |
| 2013/0283922 A1 * | 10/2013 | Qualtieri | .............. | G01Q 10/045 |
| | | | | 73/774 |
| 2017/0059420 A1 * | 3/2017 | Rey | .................... | G01C 19/5607 |

\* cited by examiner

CONSENSUS-BASED MULTI-PIEZOELECTRIC MICROCANTILEVER SENSOR

CROSS-REFERENCE TO RELATED APPLICATIONS

This application claims priority to and benefit of U.S. Provisional Patent Application Ser. No. 62/169,872, filed Jun. 2, 2015, which is fully incorporated by reference and made a part hereof.

BACKGROUND

Microcantilevers are microelectromechanical system (MEMS) devices that can comprise a micro-scale beam anchored at one end (for example, to a substrate). Among their many applications, they can be used as sensing devices in Scanning Probe Microscopes (SPMs). SPMs can use the microcantilever coupled with a complex and bulky laser system to measure the microcantilever's movements and provide a 3-D nanoscale image of physical surfaces, properties of cells and biological tissues, precise nanoscale weight of nanoparticles, and other measurements.

Furthermore, current systems only measure the deflection of the cantilever at one location, for example, the end of the cantilever. This can lead to measurement errors. This may occur, for example, if nanoscale forces are applied to other locations of the cantilever, if the nanoscale force is not applied uniformly along the cantilever, or if the measurement system is defective.

Therefore, what are needed are devices, systems and methods that overcome challenges in the present art.

SUMMARY

In one aspect of the disclosure, a MEMS device and a method of sensing based on a consensus algorithm is disclosed. Multiple piezoelectric elements on a microcantilever can provide a more accurate measurement of the microcantilever's deflection. The device can eliminate bulky laser sensors in SPM and provide additional use as a biosensor, or chemical sensor at the micro and nano-scale. A consensus sensing algorithm can provide added robustness into the system. If one of the sensing elements or electrodes fails during a sensing process, other elements can compensate and allow for near zero-error measurement. Using the sensing system described in this disclosure, less expensive and more accurate SPMs can be manufactured. The disclosed devices and methods can improve the performance of existing tools as well, as currently used SPMs can also be upgraded to the new technology.

Generally, current consensus algorithms are designed for lumped-parameter systems. In this disclosure; however, the consensus algorithm can be applied to micro-scale distributed parameter systems. Consensus algorithms are based in the area of fault tolerant systems, and represent a method whereby the agents of a certain network comes to an agreement on one or more given states by collaborating with neighboring agents. In many cases, agreement and synchronization of the elements or nodes of the system may be required to achieve a common goal. Micro-scale distributed parameter systems may benefit from consensus-based algorithms, due to the compatibility of such algorithms with the design requirements of state estimators and controllers for these systems.

In aspects of the disclosure, the piezoelectric elements can act as agents of a sensor network. In this sensor network, these agents can communicate with one another through a sensor fusion technique to provide an estimation of the deflection at different points of the microcantilever. For example, under a designed consensus algorithm as described herein, the collected data are synchronized. Redundancy is implemented in the deflection calculation so that the final deflection profile obtained is robust against uncertainty and noise. Hence, in various aspects of this disclosure, the approach can be used to provide an accurate estimation of the deflection of the microcantilever. In order to measure the deflection at one point of the microcantilever, for example, at the tip, other sensor fusion techniques can also be implemented. Using sensor fusion techniques, the obtained data by the piezoelectric elements are augmented to provide a more accurate measurement of the deflections.

In an aspect of this disclosure, a sensor is disclosed. The sensor can comprise: a substrate; a microcantilever having one end operatively coupled to the substrate; and a plurality of piezoelectric elements that can be operatively connected to at least one surface of said microcantilever, wherein multiple signals can be generated by the plurality of piezoelectric elements at one or more locations on the microcantilever to detect deflections at the one or more locations. Moreover, one or more electrodes can be configured to receive one or more of voltage and current signals from the plurality of piezoelectric elements. Similarly, Moreover, one or more electrodes can be configured to receive one or more of voltage and current signals from one or more power sources for applying voltage to the plurality of piezoelectric elements. Multiple signals can be used to determine a deflection of the microcantilever from a reference position. In one aspect, the microcantilever can comprise a tip having a pointed portion. The piezoelectric elements can be arranged in an array. The substrate can comprise one or more compounds selected from the group comprising an insulator, metal, or semiconductor. The microcantilever can overhang an edge of said substrate. The microcantilever can comprise a semiconductor. The semiconductor can comprise one or more compounds selected from the group comprising silicon, silicon dioxide, silicon carbide, silicon nitride, germanium, gallium arsenide, gallium phosphide, cadmium selenide, cadmium sulfide, zinc oxide, titanium dioxide, aluminum oxide and tin oxide. The system can be used as the sensing device in SPMs. The system can be used for the measurement of material thickness. A coating on the plurality of piezoelectric elements can be configured to bind to one or more analytes. The coating on the one or more of the plurality of piezoelectric elements can be configured to measure the mechanical properties of weight, stiffness, or resonance frequency of one or more analytes. The one or more analytes can comprise chemical compounds and biological substances. The biological substances can comprise, for example, deoxyribonucleic acid (DNA) molecules. The coating can comprise a metal, a polymer, and/or a semiconductor. The piezoelectric elements can at least be partially comprised of a ceramic, such as zirconium titanate (PZT), or a semiconductor, such as zinc oxide. The zinc oxide can be polycrystalline. The piezoelectric elements can also be at least partially comprised of a polymer. The polymer can comprise polyvinylidene fluoride (PVDF), polystyrene, polypropylene, polyethylene, acrylonitrile butadiene styrene, polycarbonate, poly(methyl methacrylate) (PMMA), polyester, polyimid, liquid crystal polymer, and polyamide.

Signals from the piezoelectric elements can be analyzed to determine a deflection of the microcantilever using, for example, a decentralized sensing method. The decentralized sensing method can comprise a sensor fusion technique such as a consensus algorithm method. An error associated with the determination of the deflection of the microcantilever by the decentralized sensing method as compared with a reference deflection measurement method can be reduced by the incorporation of additional piezoelectric elements.

In another aspect of the disclosure, a system for sensing is disclosed. The system can comprise: a substrate; a microcantilever having one end that can be operatively coupled to the substrate; a plurality of piezoelectric elements that can be operatively connected to at least one surface of said microcantilever; and a processor, wherein the processor processes multiple signals generated by the plurality of piezoelectric elements at one or more locations on the microcantilever to detect deflections at the one or more locations. Moreover, one or more electrodes can be configured to receive one or more of voltage and current signals from one or more of the plurality of piezoelectric elements. Similarly, one or more electrodes can be configured to receive one or more of voltage and current from one or more power sources for applying voltage to the plurality of piezoelectric elements. Multiple signals can be used to determine a deflection of the microcantilever from a reference position. The microcantilever can comprise a tip having a pointed portion. The piezoelectric elements can be arranged in an array. The substrate can comprise one or more compounds selected from the group comprising an insulator, metal, or semiconductor. The microcantilever can overhang an edge of said substrate. The microcantilever can comprise a semiconductor. The semiconductor can comprise one or more compounds selected from the group comprising silicon, silicon dioxide, silicon carbide, silicon nitride, germanium, gallium arsenide, gallium phosphide, cadmium selenide, cadmium sulfide, zinc oxide, titanium dioxide, aluminum oxide and tin oxide. The system can be used as the sensing device in SPMs. The system can be used for the measurement of material thickness. A coating on one or more of the plurality of piezoelectric elements can be configured to bind to one or more analytes. The coating on the one or more of the plurality of piezoelectric elements can be configured to measure the mechanical properties of weight, stiffness, or resonance frequency of one or more analytes. The one or more analytes can comprise chemical compounds and biological substances. The biological substances can comprise, for example, DNA molecules. The coating can comprise a metal, a polymer, and/or a semiconductor. At least a portion of the piezoelectric elements can comprise a ceramic, such as PZT, or a semiconductor, such as zinc oxide. The zinc oxide can be polycrystalline. The piezoelectric elements can also at least be partially comprised of a polymer. The polymer can comprise PVDF, polystyrene, polypropylene, polyethylene, acrylonitrile butadiene styrene, polycarbonate, PMMA, polyester, polyimide, liquid crystal polymer, and polyamide.

The signals generated by the piezoelectric elements can be analyzed to determine a deflection of the microcantilever using, for example, a decentralized sensing method. The decentralized sensing method can comprise a sensor fusion technique such as a consensus algorithm method. An error associated with the determination of the deflection of the microcantilever by the decentralized sensing method as compared with a reference deflection measurement method can be reduced by the incorporation of additional piezoelectric elements.

In yet another aspect of the disclosure, a method for sensing is disclosed. The method can comprise: generating multiple signals by a plurality of piezoelectric elements at one or more locations on a microcantilever to detect deflections at the one or more locations, wherein the microcantilever has one end that can be operatively coupled to a substrate, and the plurality of piezoelectric elements that can be operatively connected to at least one surface of said microcantilever; and processing, by a processor, the multiple signals generated by the plurality of piezoelectric elements. Moreover, one or more electrodes can be configured to receive one or more of voltage and current signals from the plurality of piezoelectric elements. Similarly, one or more electrodes can be configured to receive one or more of voltage and current from one or more power sources for applying voltage to the plurality of piezoelectric elements. Multiple signals can be used to determine a deflection of the microcantilever from a reference position. The microcantilever can comprise a tip having a pointed portion. The piezoelectric elements can be arranged in an array. The substrate can comprise one or more compounds selected from the group comprising an insulator, metal, or semiconductor. The microcantilever can overhang an edge of said substrate. The microcantilever can comprise a semiconductor. The semiconductor can comprise one or more compounds selected from the group comprising silicon, silicon dioxide, silicon carbide, silicon nitride, germanium, gallium arsenide, gallium phosphide, cadmium selenide, cadmium sulfide, zinc oxide, titanium dioxide, aluminum oxide and tin oxide. The system can be used as the sensing device in SPMs. The system can be used for the measurement of material thickness. A coating on one or more of the plurality of piezoelectric elements can be configured to bind to one or more analytes. The one or more analytes can comprise chemical compounds and biological substances. The coating on the one or more of the plurality of piezoelectric elements can be configured to measure the mechanical properties of weight, stiffness, or resonance frequency of one or more analytes. The biological substances can comprise, for example, DNA molecules. The coating can comprise a metal, a polymer, and/or a semiconductor. The piezoelectric elements can at least partially comprised of a ceramic, such as PZT or a semiconductor, such as zinc oxide. The zinc oxide can be polycrystalline. The piezoelectric elements can also be at least partially comprised of a polymer. The polymer can comprise PVDF, polystyrene, polypropylene, polyethylene, acrylonitrile butadiene styrene, polycarbonate, PMMA, polyester, polyimide, liquid crystal polymer, and polyamide.

The signals can be analyzed to determine a deflection of the microcantilever using, for example, a decentralized sensing method. The decentralized sensing method can comprise sensor fusion technique such as a consensus algorithm method. An error associated with the determination of the deflection of the microcantilever by the decentralized sensing method as compared with a reference deflection measurement method can be reduced by the incorporation of additional piezoelectric elements.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The components in the drawings are not necessarily to scale relative to each other and like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
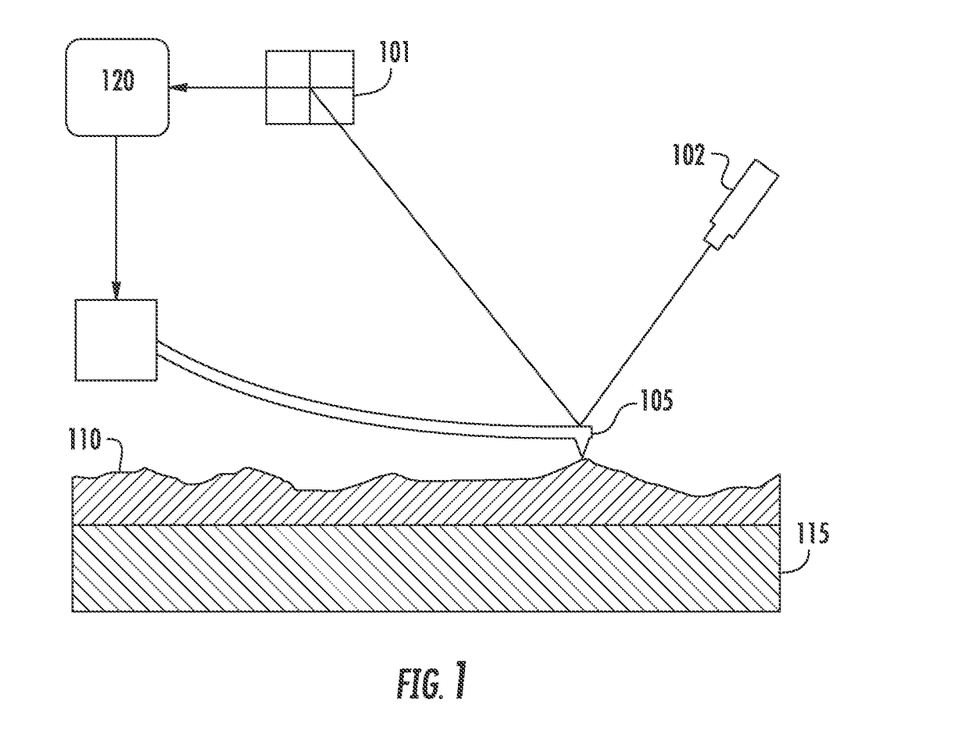
FIG. 1 shows current SPMs using a laser sensor to measure microcantilever movements.

In one aspect of the disclosure, devices and algorithms are disclosed relating to microcantilever sensors. Microcantilevers can be used, for example, as a sensing device in SPMs. FIG. 1 shows a SPM using a laser and a photodiode to measure the microcantilever deflection as it moves over the scans the area of a sample, e.g. a thin film. Deflections may range, for example, from few tens to few hundreds or thousands of nanometers. The setup can comprise a laser 102 shining light onto the microcantilever and tip 105. As the microcantilever and tip 105 scan the area of thin film 110 using a piezotube scanner 115, the microcantilever vibrates. This can cause the reflected laser beam to differentially fall upon a photodiode 101, tracing the vibration of the microcantilever. The changing signal generated by the photodiode 101 can be detected by the detector and feedback electronics 120. This can be used to determine features of the sample surface, in addition to imaging the surface.

In one aspect, embodiments of the device described herein can be integrated into existing SPM setups, such as that shown in FIG. 1, eliminating the need for the laser and photodiode. In this way, a series of piezoelectric elements operatively connected to the microcantilever can be used. In one aspect of the disclosure, the piezoelectric elements can operate in concert with a consensus algorithm. The device can thereby, for example, be used for the measurement of material thickness. Moreover, a coating on one or more of the series of piezoelectric elements can be configured to bind to one or more analytes. The coating on the one or more of the plurality of piezoelectric elements can be configured to measure the mechanical properties of weight, stiffness, or resonance frequency of one or more analytes. The one or more analytes can comprise, for example, chemical compounds and biological substances such as deoxyribonucleic acid (DNA) molecules. The coating can comprise, for example, a metal, polymer, a semiconductor, and an organic semiconductor.

Figure 2A:
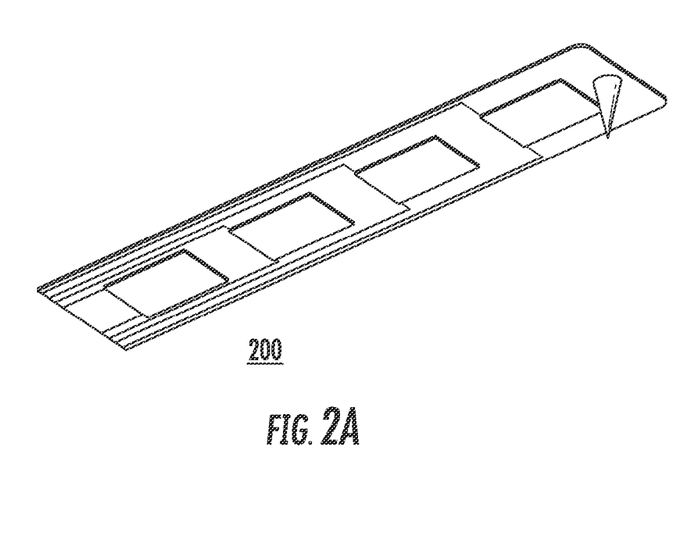
FIGS. 2A and 2B show a microcantilever having multiple piezoelectric elements operatively coupled to it.
Figure 2B:
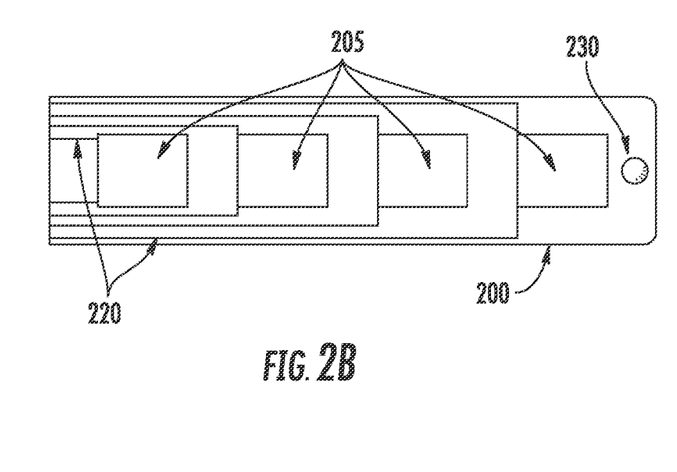

FIGS. 2A and 2B show another aspect of the disclosure, including a microcantilever 200 that has multiple piezoelectric elements 205 operatively connected to one of the surfaces of the microcantilever 200. The microcantilever 200 may include a tip 230 fabricated at the free end of the microcantilever, for example, for use in Atomic Force Microscopy (AFM). The individual piezoelectric elements 205 may be connected to a power source through electrode connections 220. Any number of piezoelectric elements 205 can be used, from one to as many as the size of microcantilever 200 and manufacturing limitations allow. Moreover, errors from the determination of the deflection of the microcantilever 200 by a decentralized control method (such as the consensus algorithm) as compared with a reference deflection measurement method can be reduced by the incorporation of additional piezoresistive elements 205. Though FIGS. 2A and 2B show the piezoelectric elements 205 on only one side of the microcantilever 200, it is to be appreciated that the piezoelectric elements 205 can be located on the top, bottom or any surface of the microcantilever 200.

Moreover, the microcantilever 200 can at least partially comprise a semiconductor. The semiconductor can comprise one or more compounds such as silicon, silicon dioxide, silicon carbide, silicon nitride, germanium, gallium arsenide, gallium phosphide, cadmium selenide, cadmium sulfide, zinc oxide, titanium dioxide, aluminum oxide, tin oxide, and the like. The piezoelectric elements 205 may be at least partially constructed from any piezoelectric material, including a ceramic. The ceramic can comprise, for example, PZT. Alternatively the piezoelectric material can comprise a semiconductor such as zinc oxide. The zinc oxide can be polycrystalline. The piezoelectric material can further comprise a polymer, including but not limited to: PVDF, polystyrene, polypropylene, polyethylene, acrylonitrile butadiene styrene, polycarbonate, PMMA, polyester, polyimide, liquid crystal polymer, and polyamide.

The piezoelectric elements 205 may be arranged, for example, in an array or in series along the microcantilever 200. The piezoelectric elements 205 can all be identical, all different, or some combination thereof in terms of dimensions, composition, and other properties. In one aspect, the piezoelectric elements 205 may be addressed individually and electrically isolated from one another. In another aspect, the piezoelectric elements 205 may be electrically connected in series. The series-connected piezoelectric elements 205 may be connected to as few as two electrical connections to the piezoelectric elements 205. In another possible configuration, the piezoelectric elements 205 can be electrically connected in parallel. In another configuration, the piezoelectric elements 205 can be electrically connected in a series-parallel arrangement. The piezoelectric elements 205 may furthermore be arranged on any surface of the microcantilever.

Figure 3:
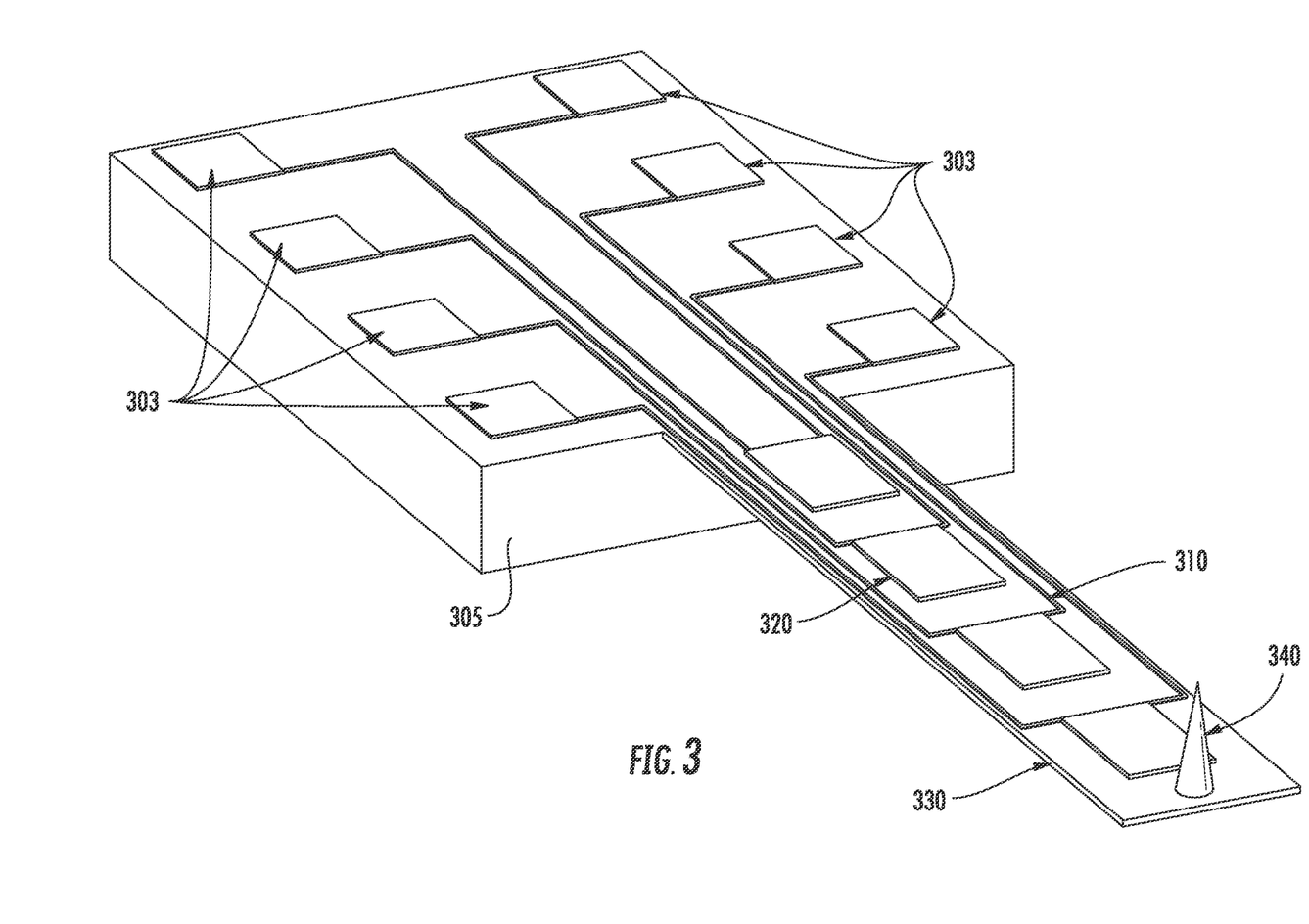
FIG. 3 shows the microcantilever with base electrodes.

FIG. 3 shows a microcantilever 330 with base electrodes 303 for obtaining measurement signals from piezoelectric elements 320. The electrodes 303 receive one or both of voltage and current from piezoelectric elements 320. The individual piezoelectric elements 320 can be connected to a corresponding number of base electrodes 303 though electrode connections 310. The microcantilever 330 (possibly including the AFM tip 340 in some applications) can be configured to hang over the edge of a substrate 305. The substrate 305 can comprise one or more of an insulator, metal, or semiconductor.

The piezoelectric elements 320 can generate a signal based on the static and dynamic deflections of the microcantilever 330. The microcantilever 330 may be driven by any suitable actuation mechanism, for example, a piezoelectric, an electrostatic, a thermal, a magnetic, or other drive mechanism. The microcantilever 330 can bend when contacts or becomes proximate to a sample surface, for example, a metallic surface, a polymeric surface, a cells, a tissue, or DNA. Also, the microcantilever 330 can bend when is coated with chemical or biological samples, for example, DNA, bacteria, tissues, or cells. The bending deflection in the microcantilever 330 can generate a voltage or current signal in the piezoelectric elements 320. When an oscillating bending force is applied to the microcantilever 330, the piezoelectric elements 320 can generate oscillating signals. The generated signals may be used to determine one or more of: static deflections, quasi-static deflections, oscillation amplitudes, and frequencies of the microcantilever 330.

Alternatively or optionally, the one or more electrodes 303 can be configured to receive one or more of voltage and current from one or more power sources (not shown) for applying voltage and/or current to the plurality of piezoelectric elements 320. When voltage or current is applied to the piezoelectric elements 320, the microcantilever 330 may bend according to the level of the voltage or current. When an oscillating voltage is applied to the piezoelectric elements 320 or the microcantilever 330, the microcantilever 330 may be driven at or near a natural resonant frequency and may achieve much larger amplitudes than, for example, statically driven microcantilevers. The achieved deflection amplitude may depend, for example, on one or more of the following factors: the frequency and mode of oscillation, the internal damping of the microcantilever 330 and/or piezoelectric elements 320 and any applied materials on top of either the microcantilevers 330 and/or piezoelectric elements 320, and viscous damping due to gas or liquids surrounding the device. The same piezoelectric elements 320 may be used to drive the microcantilever 330 into oscillation, as well as to sense the displacements.

Control circuitry may be provided to control the microcantilever 330. The control circuitry can comprise circuits and electronic devices to drive the microcantilever 330 into oscillation and to measure deflection amplitudes of the microcantilever 330. Controlling and monitoring of the microcantilever 330 and positioning elements may be done with the control circuitry. Control circuitry may further include, for example, drive circuitry and sensing circuitry.

In another aspect of this disclosure, the fabrication process of a microcantilever sensor is disclosed. FIGS. 4A-4H and 5A-5F show the microcantilever and some of its components. The fabrication method presented here is based on current methodologies. However, many other similar methods may be used to fabricate the device.

One consideration that may exist includes present manufacturing practices as relates to the number of piezoelectric sensors and their connections to electrodes. Connections may have, for example, approximately 7 μm width resolution, though other widths can be implemented. Assuming an approximately 7 μm space between each electrode connection (and between sensors and connections), then the following equation shows the width for electrodes based on number of piezoelectric sensors, N, (there are 2 electrode connections for each sensor):

$$\text{Connections width}=2[7(N-1)+7(N)]=28N-14$$

The piezoelectric sensor closest to the base may not need extra width. Based on the equation, for a four-sensor microcantilever, the width for electrodes can be approximately 98 μm. Assuming the width of the piezoelectric sensors is approximately 50 μm then the width of the microcantilever can be approximately 150 μm. This shows the increase in the number of piezoelectric sensors can increase both width and length of the microcantilever.

Figure 4A:
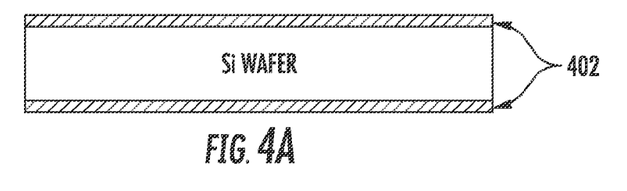
FIGS. 4A-4G show an overview of the fabrication process for the microcantilever and piezoelectric elements.
Figure 4B:
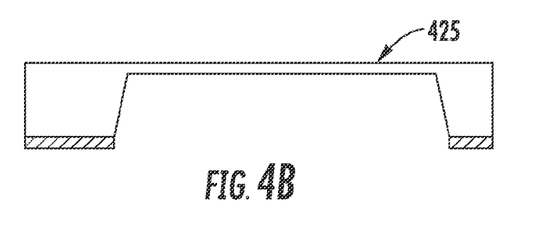
Figure 4C:
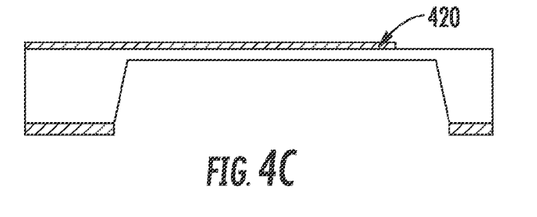
Figure 4D:
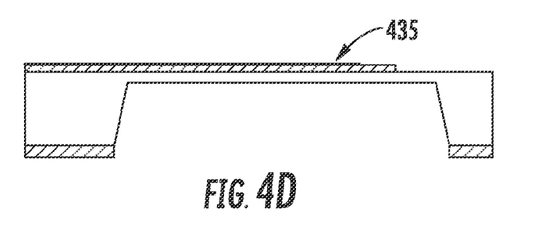
Figure 4E:
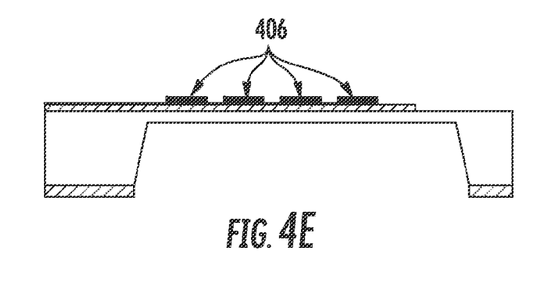
Figure 4F:
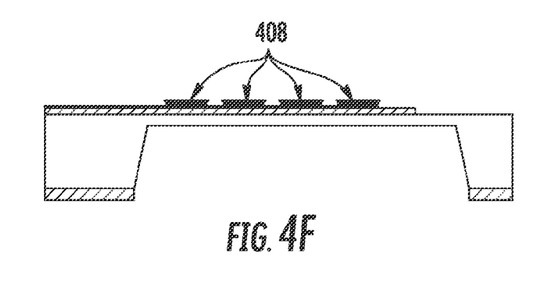
Figure 4G:
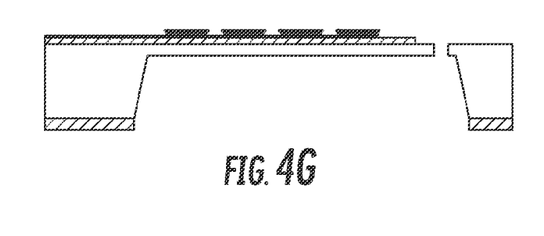

In one example, a silicon wafer can be used for the fabrication of the device. The steps of the exemplary process are shown in FIGS. 4A-4G. Both sides of the wafer can be first covered by silicon dioxide ($SiO_2$) 402 using, for example, thermal growth, as shown in FIG. 4A. This layer can serve as a mask for the next etching step. Deep reactive etching (DRIE) can, for example, be used for making the $SiO_2$ mask both on the top and bottom sides. Wet etching of the silicon can, for example, be performed using a potassium hydroxide (KOH) solution, as shown in FIG. 4B, resulting in the remaining structure 425. Another $SiO_2$ layer 420 can be used to cover the top surface to insulate the electrodes from the microcantilever by, for example, Chemical Vapor Deposition (CVD), as shown in FIG. 4C. Base electrodes 435 can be deposited by, for example, Radio-Frequency (RF) Sputtering. The electrodes can be made of Platinum (Pt)/Titanium (Ti), as shown in FIG. 4D. The Ti thin film may enhance the adhesion of the Pt film to the piezoelectric layer. The patterns in this step can be formed using, for example, a lift-off technique. In one exemplary aspect, the piezoelectric layer can be zinc oxide or PZT. The PZT film 406 can be made of, for example, Zr/Ti and can be prepared, for example, using a sol-gel process. As shown in FIG. 4E, the PZT layer can be, for example, spin-coated on the microcantilever. In the next step, the top Pt/Ti electrodes 408 can be deposited using, for example, a sputtering method, as shown in FIG. 4F. In the final step, as shown in FIG. 4G, the microcantilever sensor 410 can be detached. A thorough test of the sensor may be performed to assure the quality of the product.

Figure 5A:
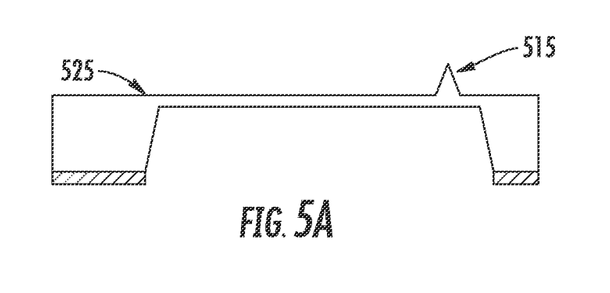
FIGS. 5A-5F show an overview of the fabrication process for the microcantilever with a sharp tip.
Figure 5B:
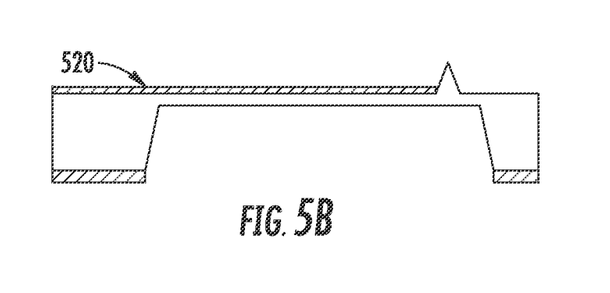
Figure 5C:
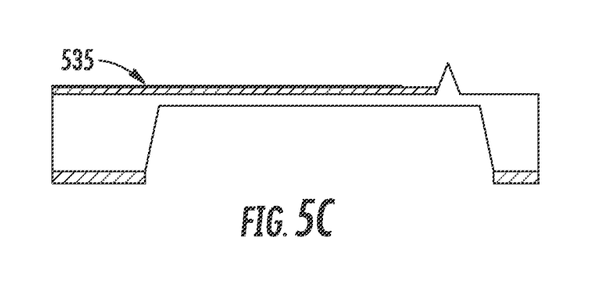
Figure 5D:
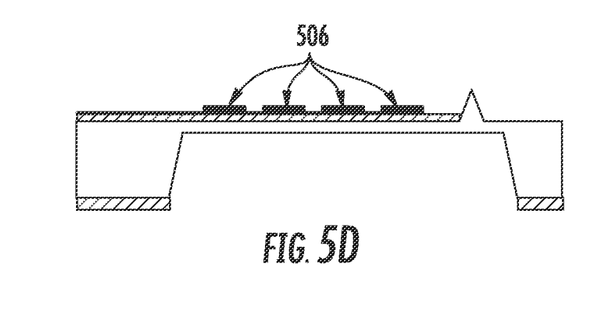
Figure 5E:
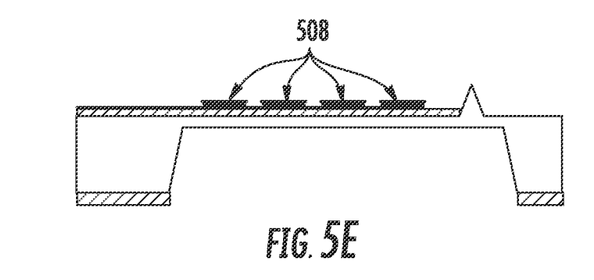
Figure 5F:
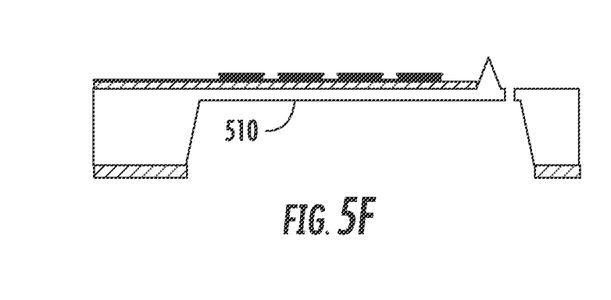

In another example, a silicon microcantilever with a sharp tip can be used for the fabrication of the device. The steps of the exemplary process are shown in FIGS. 5A-5F. Preliminary process can be performed by various methods to fabricate the silicon structure 525 with a sharp tip 515, as shown in FIG. 5A. The sharp tip 515 can be made of materials such as, silicon, tungsten, quartz, and diamond. A $SiO_2$ layer 520 can be used to cover the top surface to insulate the electrodes from the microcantilever by, for example, Chemical Vapor Deposition (CVD), as shown in FIG. 5B. Base electrodes 535 can be deposited by, for example, Radio-Frequency (RF) Sputtering. The electrodes can be made of Platinum (Pt)/Titanium (Ti), as shown in FIG. 5C. The Ti thin film may enhance the adhesion of the Pt film to the piezoelectric layer. The patterns in this step can be formed using, for example, a lift-off technique. In one exemplary aspect, the piezoelectric layer can be zinc oxide or PZT. The PZT film 506 can be made of, for example, Zr/Ti and can be prepared, for example, using a sol-gel process. As shown in FIG. 5D, the PZT layer can be, for example, spin-coated on the microcantilever. In the next step, the top Pt/Ti electrodes 508 can be deposited using, for example, a sputtering method, as shown in FIG. 5E. In the final step, as shown in FIG. 5F the microcantilever sensor 510 can be detached. A thorough test of the sensor may be performed to assure the quality of the product.

Alternatively, an AFM microcantilever with tip can also be used as base and the piezoelectric elements can be added to the microcantilever.

Figure 6:
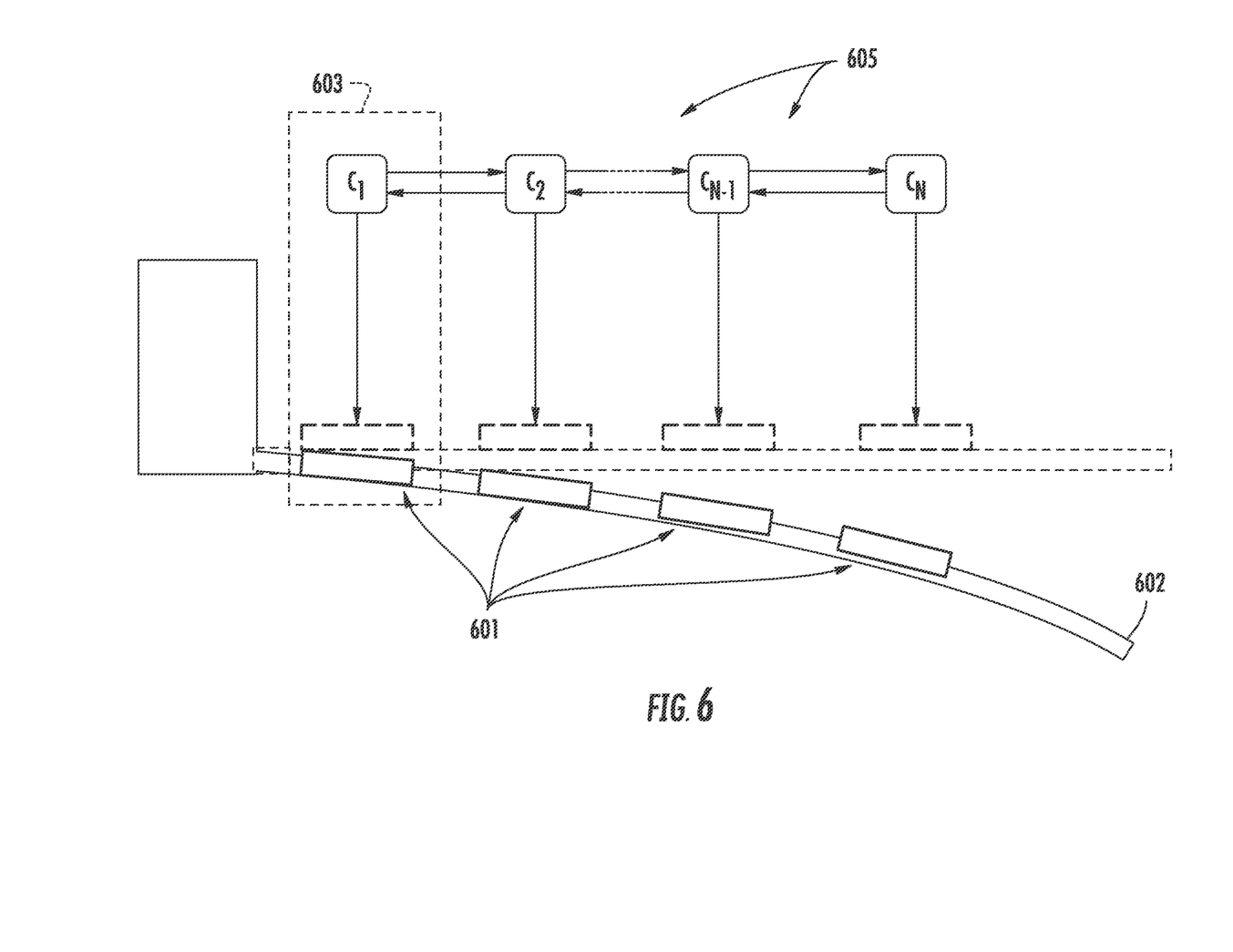
FIG. 6 shows an overview of the consensus observer sensing system.

As shown in FIG. 6, the piezoelectric elements 601 on the surface of the microcantilever 602 can be considered to be the signal generating units of agents in a sensor network. As illustrated by the graphic of FIG. 6, these agents 603 can be connected to one another. The connections 605 in this graphic can represent a send and receive scheme. The connections 605 can be applied mathematically to the dynamics as described by one or more microcantilever model(s). A consensus term can be integrated into the distributed dynamics of a deflection estimator, in order to remove measurement disagreements between the agents. The distributed consensus aspect of the designed deflection estimator for a micro-scale sensor can provide some advantages. First, the effect of uncertainties, disturbances, and miniscule, yet significant forces that cannot be modeled or measured easily can be compensated using the inherent redundancy in the dynamics of the consensus design. Second, the multi-piezoelectric microcantilever sensor can be robust to failures in a number of piezoelectric elements. Since estimation is procured in a decentralized manner, failure in some agents may not affect estimation performance greatly, as other agents can compensate for the loss of failed agents. Although estimation accuracy might be reduced, an acceptable estimation can still be obtained. In addition, the measurement may be more accurate than using a single of piezoelectric element since the data can be collected from different points alongside the microcantilever, which can have various associated uncertainties and disturbances.

Figure 7:
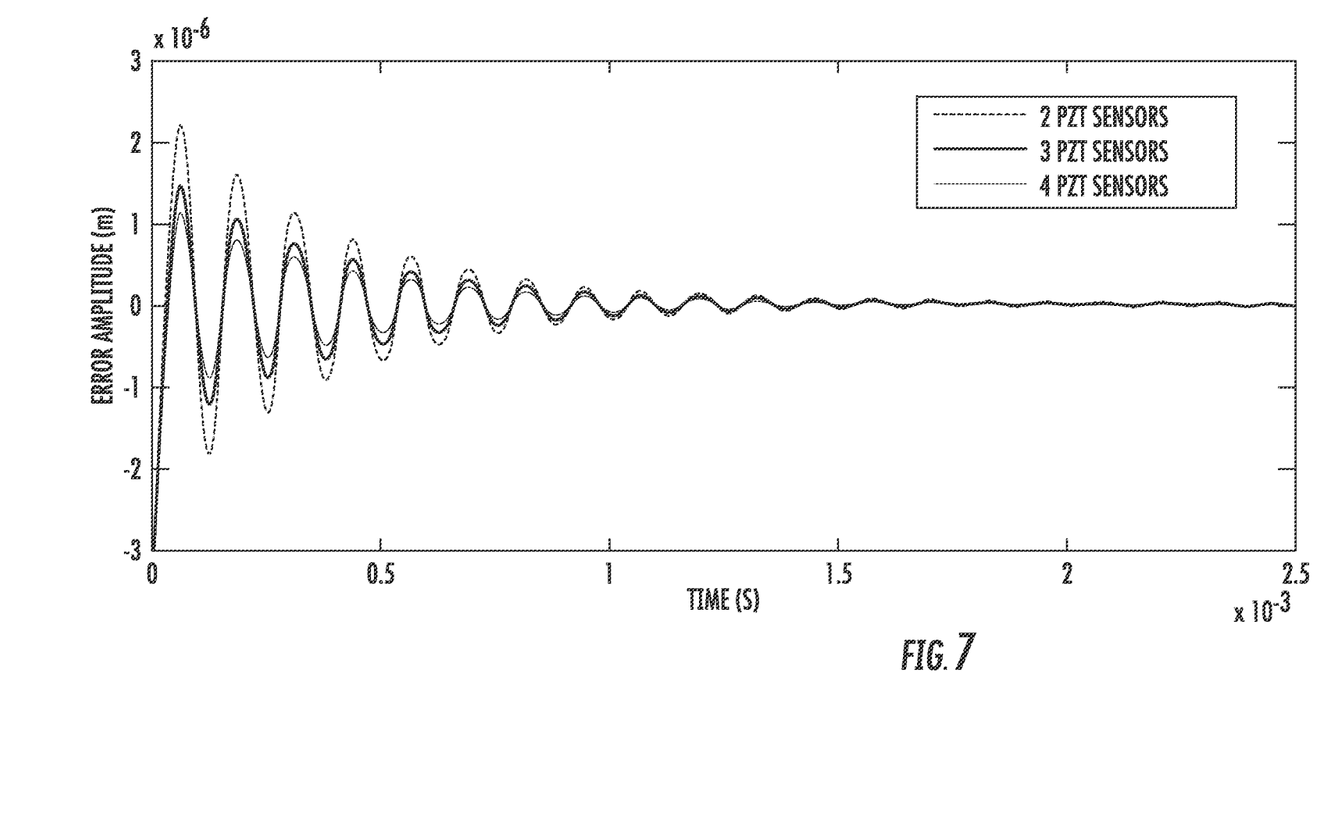
FIG. 7 shows the effect of the different numbers of piezoelectric sensor elements on the error of measurements of the deflection of the microcantilever.

As described herein, the number of piezoelectric elements on the microcantilever can be dependent on the width, length, and fabrication limitations of the microcantilever. FIG. 7 shows deflection estimation error at the tip of a sample microcantilever in resonant excitations. In FIG. 7, the effect of different numbers of piezoelectric sensor elements can be compared. As shown, the error estimation for amplitudes can be studied for two to four piezoelectric sensor elements. The convergence time and maximum estimation error decrease as the number of piezoelectric agents increase. For four piezoelectric sensors, the settling time can be under approximately 0.001 second. In addition, four piezoelectric elements may provide a safety net if one of the sensors fail, then the system can automatically act as a three sensor system. In one aspect of the disclosure, the implementation of a consensus-based sensor fusion technique can be used for measuring data by individual piezoelectric sensors on the microcantilever beam. Moreover, other sensor fusion approaches may also be used for collecting the data from the multi-element piezoelectric microcantilever to generate a deflection estimation. Thus, a decentralized observer can be developed based on the concept of consensus algorithm. This approach can have many advantages as compared with centralized approaches for state-estimation.

Figure 8:
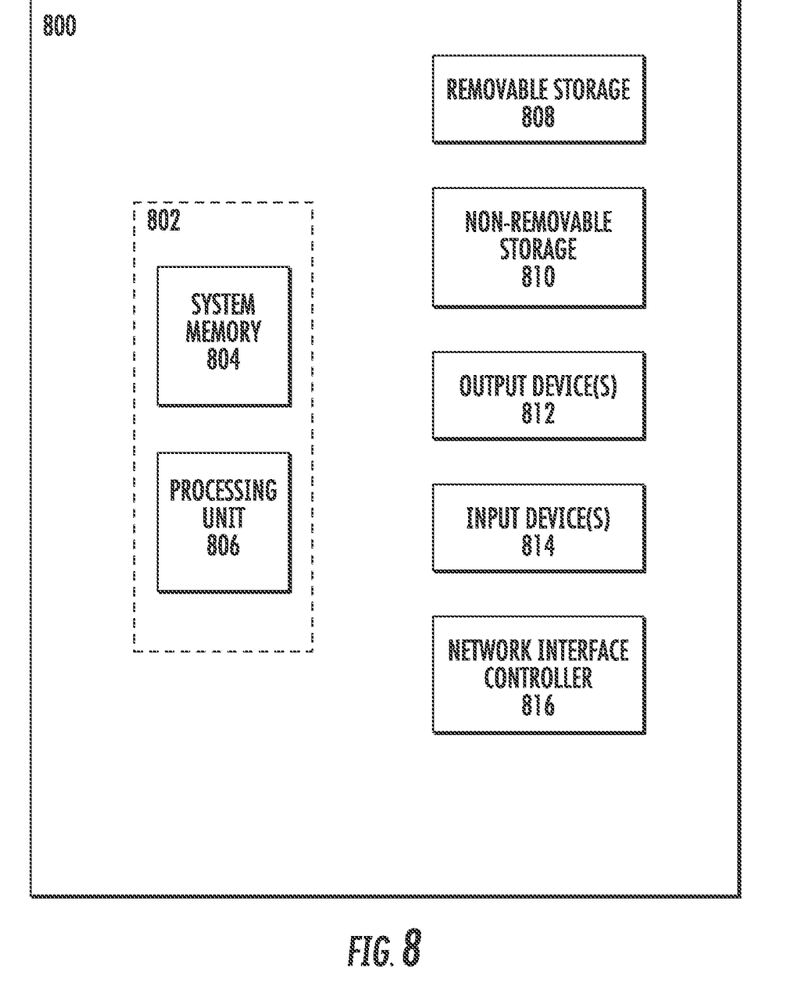
FIG. 8 shows a possible computing platform for implementing aspects of the disclosure.

When the logical operations described herein are implemented in software, the process may execute on any type of computing architecture or platform. For example, referring to FIG. 8, an example computing device upon which embodiments of the disclosure may be implemented is illustrated. The processing unit 800 may include a bus or other communication mechanism for communicating information among various components of the processing unit 800. In its most basic configuration, processing unit 800 typically includes at least one processor 806 and system memory 804. Depending on the exact configuration and type of computing device, system memory 804 may be volatile (such as random access memory (RAM)), non-volatile (such as read-only memory (ROM), flash memory, etc.), or some combination of the two. This most basic configuration is illustrated in FIG. 8 by dashed line 802. The processor 806 may be a standard programmable processor that performs arithmetic and logic operations necessary for operation of the processing unit 800.

Processing unit 806 may have additional features/functionality. For example, processing unit 806 may include additional storage such as removable storage 808 and non-removable storage 810 including, but not limited to, magnetic or optical disks or tapes. Processing unit 808 may also contain network connection(s) 816 that allow the device to communicate with other devices. Processing unit 808 may also have input device(s) 814 such as a keyboard, mouse, touch screen, etc. Output device(s) 812 such as a display, speakers, printer, etc. may also be included. The additional devices may be connected to the bus in order to facilitate communication of data among the components of the processing unit 806. All these devices are well known in the art and need not be discussed at length here.

The processor 806 may be configured to execute program code encoded in tangible, computer-readable media. Computer-readable media refers to any media that is capable of providing data that causes the processing unit 800 (i.e., a machine) to operate in a particular fashion. Various computer-readable media may be utilized to provide instructions to the processor 806 for execution. Common forms of computer-readable media include, for example, magnetic media, optical media, physical media, memory chips or cartridges, a carrier wave, or any other medium from which a computer can read. Example computer-readable media may include, but is not limited to, volatile media, non-volatile media and transmission media. Volatile and non-volatile media may be implemented in any method or technology for storage of information such as computer readable instructions, data structures, program modules or other data and common forms are discussed in detail below. Transmission media may include coaxial cables, copper wires and/or fiber optic cables, as well as acoustic or light waves, such as those generated during radio-wave and infra-red data communication. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processor 800 may execute program code stored in the system memory 804. For example, the bus may carry data to the system memory 804, from which the processor 806 receives and executes instructions. The data received by the system memory 8504 may optionally be stored on the removable storage 808 or the non-removable storage 810 before or after execution by the processor 806. For example, the processor 800 may execute code to perform operations for carrying out the consensus algorithm, as described herein.

Processing unit 800 typically includes a variety of computer-readable media. Computer-readable media can be any available media that can be accessed by device 800 and includes both volatile and non-volatile media, removable and non-removable media. Computer storage media include volatile and non-volatile, and removable and non-removable media implemented in any method or technology for storage of information such as computer readable instructions, data structures, program modules or other data. System memory 804, removable storage 808, and non-removable storage 810 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by processing unit 800. Any such computer storage media may be part of processing unit 800.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

CONCLUSION

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A system for sensing comprising:
   a substrate;
   a microcantilever having one end operatively coupled to the substrate;
   two or more piezoelectric elements arranged in an array along a length of the microcantilever and each of the two or more piezoelectric elements are operatively connected to at least one surface of said microcantilever, wherein each of the two or more piezoelectric elements generates a signal indicating a deflection of the microcantilever at a location along the length of the microcantilever and wherein the signals are analyzed to determine a total deflection of the microcantilever using a decentralized control method,
   wherein said decentralized control method comprises a consensus method and an error associated with the determination of the deflection of the microcantilever by the decentralized control method as compared with a reference deflection measurement method is reduced by the incorporation of additional piezoelectric elements.

2. The system of claim 1, wherein one or more electrodes are configured to receive one or more of voltage and current signals from one or more of the two or more piezoelectric elements and the signals are used to determine a deflection of the microcantilever from a reference position.

3. The system of claim 1, wherein the microcantilever further comprises one or more of:
a tip having a pointed portion;
the substrate comprises one or more compounds selected from the group comprising an insulator, metal, or semiconductor; the microcantilever overhangs an edge of said substrate;
the microcantilever comprises a semiconductor; and
the semiconductor comprises one or more compounds selected from the group comprising silicon, silicon dioxide, silicon carbide, silicon nitride, germanium, gallium arsenide, gallium phosphide, cadmium selenide, cadmium sulfide, zinc oxide, titanium dioxide, aluminum oxide and tin oxide.

4. The system of claim 1 further comprising a coating on one or more of the two or more piezoelectric elements, wherein the coating on one or more of the two or more piezoelectric elements is configured to measure mechanical properties of one or more analytes, wherein the mechanical properties comprise one or more of weight, stiffness, or resonance frequency of the one or more analytes.

5. The system of claim 4, wherein the one or more analytes comprise one or more of:
chemical compounds and biological substances, wherein the biological substances comprises DNA molecules.

6. The system of claim 4, wherein the coating comprises one or more of:
a metal;
a polymer; and
a semiconductor.

7. The system of claim 1, wherein one or more of the two or more piezoelectric elements are at least partially comprised of one or more of:
a piezoelectric ceramic material;
a semiconductor material; and
a polymer.

8. The system of claim 7, wherein the piezoelectric ceramic material comprises one or more of lead zirconium titanate (PZT) or polycrystalline zinc oxide, and wherein the polymer comprises one of the group comprising polyvinylidene fluoride (PVDF), polystyrene, polypropylene, polyethylene, acrylonitrile butadiene styrene, polycarbonate, poly(methyl methacrylate) (PMMA), polyester, polyimid, liquid crystal polymer, and polyamide.

9. A system for sensing comprising:
a substrate;
a microcantilever having one end operatively coupled to the substrate;
two or more piezoelectric elements arranged in an array along a length of the microcantilever, each of the two or more piezoelectric elements operatively connected to at least one surface of said microcantilever; and a processor,
wherein the processor executes computer-readable instructions to receive and process multiple signals generated by the two or more piezoelectric elements at one or more locations on the microcantilever to detect deflections of the cantilever at the one or more locations and to determine a total deflection of the microcantilever using a decentralized control method,
wherein said decentralized control method comprises a consensus method and an error associated with the determination of the deflection of the microcantilever by the decentralized control method as compared with a reference deflection measurement method is reduced by the incorporation of additional piezoelectric elements.

10. The system of claim 9, wherein one or more electrodes are configured to receive one or more of voltage and current signals from one or more of the two or more piezoelectric elements and the multiple signals are used to determine a deflection of the microcantilever from a reference position.

11. The system of claim 9, wherein the microcantilever further comprises one or more of:
a tip having a pointed portion;
the substrate comprises one or more compounds selected from the group comprising an insulator, metal, or semiconductor; the microcantilever overhangs an edge of said substrate;
the microcantilever comprises a semiconductor; and
the semiconductor comprises one or more compounds selected from the group comprising silicon, silicon dioxide, silicon carbide, silicon nitride, germanium, gallium arsenide, gallium phosphide, cadmium selenide, cadmium sulfide, zinc oxide, titanium dioxide, aluminum oxide and tin oxide.

12. The system of claim 9 further comprising a coating on one or more of the two or more piezoelectric elements, wherein the coating on one or more of the two or more piezoelectric elements is configured to measure mechanical properties of one or more analytes.

13. The system of claim 12, wherein the one or more analytes comprise one or more of:
chemical compounds and biological substances, wherein the biological substances comprise DNA molecules.

14. The system of claim 12, wherein the coating comprises one or more of:
a metal;
a polymer; and
a semiconductor.

15. The system of claim 9, wherein one or more of the two or more piezoelectric elements are at least partially comprised of one or more of:
a piezoelectric ceramic material;
a semiconductor material; and
a polymer.

16. The system of claim 15, wherein the piezoelectric ceramic material comprises one or more of lead zirconium titanate (PZT) or a polycrystalline zinc oxide, and wherein the polymer comprises one of the group comprising polyvinylidene fluoride (PVDF), polystyrene, polypropylene, polyethylene, acrylonitrile butadiene styrene, polycarbonate, poly(methyl methacrylate) (PMMA), polyester, polyimid, liquid crystal polymer, and polyamide.

17. A method for sensing comprising:
generating multiple signals by two or more piezoelectric elements arranged in an array at a plurality of locations along a length of a microcantilever to detect deflections at the plurality of locations, wherein the microcantilever has one end operatively coupled to a substrate, and the two or more piezoelectric elements are operatively connected to at least one surface of said microcantilever; and
processing, by a processor executing computer-readable instructions, the multiple signals generated by the plurality of piezoelectric elements, wherein the multiple signals are used to determine a total deflection of the microcantilever using a decentralized control method such that an error in measurement of the total deflection of the microcantilever is reduced by use of the two or more piezoelectric elements arranged in the array along a length of the microcantilever and wherein said decentralized control method comprises a consensus method and an error associated with the determination of the deflection of the microcantilever by the decentralized control method as compared with a reference deflection measurement method is reduced by the incorporation of additional piezoelectric elements.

18. The method of claim 17, wherein one or more electrodes are configured to receive one or more of voltage and current from one or more power sources for applying voltage to the two or more piezoelectric elements and to determine a deflection of the microcantilever from a reference position.

19. The method of claim 17, wherein the microcantilever further comprises one or more of:
   a tip having a pointed portion;
   the substrate comprises one or more compounds selected from the group comprising an insulator, metal, or semiconductor; the microcantilever overhangs an edge of said substrate;
   the microcantilever comprises a semiconductor; and
   the semiconductor comprises one or more compounds selected from the group comprising silicon, silicon dioxide, silicon carbide, silicon nitride, germanium, gallium arsenide, gallium phosphide, cadmium selenide, cadmium sulfide, zinc oxide, titanium dioxide, aluminum oxide and tin oxide.

20. The method of claim 17, wherein a coating on one or more of the two or more piezoelectric elements is configured to bind to one or more analytes, wherein the one or more analytes comprise chemical compounds and biological substances, and wherein the biological substances comprises DNA molecules.

21. The method of claim 20, wherein the coating comprises one or more of:
   a metal;
   a polymer; and
   a semiconductor.

22. The method of claim 17, wherein one or more of the two or more piezoelectric elements are at least partially comprised of one or more of:
   a ceramic;
   a semiconductor; and
   a polymer.

23. The method of claim 22, wherein the ceramic comprises lead zirconium titanate (PZT), the semiconductor comprises polycrystalline zinc oxide, and the polymer comprises one of the group comprising polyvinylidene fluoride (PVDF), polystyrene, polypropylene, polyethylene, acrylonitrile butadiene styrene, polycarbonate, poly(methyl methacrylate) (PMMA), polyester, polyimid, liquid crystal polymer, and polyamide.

* * * * *